US012652019B2

(12) United States Patent
Miyamoto

(10) Patent No.: US 12,652,019 B2
(45) Date of Patent: Jun. 9, 2026

(54) ACOUSTIC WAVE DEVICE

(71) Applicant: Murata Manufacturing Co., Ltd., Nagaokakyo (JP)

(72) Inventor: Koji Miyamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 828 days.

(21) Appl. No.: 18/092,968

(22) Filed: Jan. 4, 2023

(65) Prior Publication Data

US 2023/0143523 A1     May 11, 2023

Related U.S. Application Data

(63) Continuation of application No. PCT/JP2021/023629, filed on Jun. 22, 2021.

(30) Foreign Application Priority Data

Jul. 17, 2020     (JP) ................................. 2020-122999

(51) Int. Cl.
*H03H 9/00*          (2006.01)
*H03H 9/02*          (2006.01)
(Continued)

(52) U.S. Cl.
CPC .......... *H03H 9/173* (2013.01); *H03H 9/0211* (2013.01); *H03H 9/13* (2013.01)

(58) Field of Classification Search
CPC ........ H03H 9/173; H03H 9/0211; H03H 9/13; H03H 9/02992; H03H 9/02574; H03H 9/1457
See application file for complete search history.

(56) References Cited

U.S. PATENT DOCUMENTS

2016/0072475 A1     3/2016  Mimura et al.
2017/0222619 A1     8/2017  Iwamoto et al.
(Continued)

FOREIGN PATENT DOCUMENTS

CN          105284047 A      1/2016
CN          109698681 A      4/2019
(Continued)

OTHER PUBLICATIONS

International Search Report in PCT/JP2021/023629, mailed Sep. 7, 2021, 3 pages.
(Continued)

*Primary Examiner* — Julio C. Gonzalez
(74) *Attorney, Agent, or Firm* — Keating & Bennett, LLP

(57)          ABSTRACT

An acoustic wave device includes a piezoelectric substrate, and an IDT electrode on the piezoelectric substrate, and the IDT electrode includes an intersection region in which first and second electrode fingers overlap each other in an acoustic wave propagation direction, the intersection region includes a central region and first and second low acoustic velocity regions outside the central region on respective sides in an extending direction of the first and second electrode fingers, first and second busbars include first and second cavities, respectively, first and second inner busbar portions on one side of the first and second cavities, and first and second outer busbar portions on another side are connected by first and second connecting portions, and at least one of the first connecting portions and at least one of the second connecting portions are a first wide width connecting portion and a second wide width connecting portion having a width wider than that of each of remaining first and second connecting portions.

20 Claims, 9 Drawing Sheets

(51) Int. Cl.
   H03H 9/13          (2006.01)
   H03H 9/17          (2006.01)

(56)                    References Cited

U.S. PATENT DOCUMENTS

2019/0123713 A1*   4/2019   Daimon  ............... H03H 9/1457
2020/0304096 A1    9/2020   Suzuki et al.
2021/0250013 A1*   8/2021   Mimura  ............... H10N 30/877

FOREIGN PATENT DOCUMENTS

| JP | 2008103954 A | 5/2008 |
| JP | 2015056746 A | 3/2015 |
| JP | 2018174595 A | 11/2018 |
| JP | 2019080093 A | 5/2019 |
| WO | 2019123812 A1 | 6/2019 |

OTHER PUBLICATIONS

Written Opinion in PCT/JP2021/023629, mailed Sep. 7, 2021, 3 pages.
Official Communication issued in corresponding Chinese Patent Application No. 202180048532.0, mailed on Jun. 4, 2025, 6 pages.

\* cited by examiner

ACOUSTIC WAVE DEVICE

CROSS REFERENCE TO RELATED APPLICATIONS

This application claims the benefit of priority to Japanese Patent Application No. 2020-122999 filed on Jul. 17, 2020 and is a Continuation Application of PCT Application No. PCT/JP2021/023629 filed on Jun. 22, 2021. The entire contents of each application are hereby incorporated herein by reference.

BACKGROUND OF THE INVENTION

1. Field of the Invention

The present invention relates to an acoustic wave device including first and second busbars, each of which includes a plurality of cavities inside.

2. Description of the Related Art

In the related art, in order to suppress transverse mode ripples, an acoustic wave device using a piston mode has been known. For example, in Japanese Unexamined Patent Application Publication No. 2018-174595, in an intersection region of an interdigital transducer (IDT) electrode, a central region and a low acoustic velocity region on each side of the central region are provided. In addition, a busbar includes a plurality of cavities in a propagation direction. A portion in the busbar on an intersection region side of each cavity is an inner busbar portion, and an outer side portion opposite to the intersection region is an outer busbar portion. The inner busbar portion and the outer busbar portion are connected to each other by a plurality of fine connecting portions. As a result, a portion including the cavity is defined, together with the inner busbar portion, as a high acoustic velocity region.

SUMMARY OF THE INVENTION

In the acoustic wave device described in Japanese Unexamined Patent Application Publication No. 2018-174595, the inner busbar portion and the outer busbar portion are connected to each other by the plurality of fine connecting portions. Therefore, there has been a problem in which the Q characteristics degrade.

Preferred embodiments of the present invention provide acoustic wave devices that are each less likely to generate degradation of Q characteristics.

According to a preferred embodiment of the present invention, an acoustic wave device includes a piezoelectric substrate, and an IDT electrode on the piezoelectric substrate. The IDT substrate includes a first busbar and a second busbar facing each other, a plurality of first electrode fingers extending toward the second busbar from the first busbar, and a plurality of second electrode fingers extending toward the first busbar from the second busbar, an intersection region in which the first electrode fingers and the second electrode fingers overlap each other in an acoustic wave propagation direction includes a central region located at a center in an extending direction of the first electrode fingers and the second electrode fingers, and a first low acoustic velocity region and a second low acoustic velocity region outside the central region on respective sides in the extending direction of the first electrode fingers and the second electrode fingers, acoustic velocities in the first low acoustic velocity region and the second low acoustic velocity region are lower than an acoustic velocity in the central region, the first busbar and the second busbar each include a plurality of cavities in the acoustic wave propagation direction, a portion on an intersection region side of the plurality of cavities in the first busbar and a portion on an intersection region side of the plurality of cavities in the second busbar are a first inner busbar portion and a second inner busbar portion, respectively, a portion on a side opposite to the intersection region of the plurality of cavities in the first busbar and a portion on a side opposite to the intersection region of the plurality of cavities in the second busbar are a first outer busbar portion and a second outer busbar portion, respectively, the first inner busbar portion and the second inner busbar portion are connected to the first outer busbar portion and the second outer busbar portion by a plurality of connecting portions, and at least one of the plurality of connecting portions is a wide width connecting portion with a dimension in the acoustic wave propagation direction larger than a dimension of each of the remaining connecting portions.

According to preferred embodiments of the present invention, acoustic wave devices that are each less likely to generate degradation of the Q characteristics can be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, specific preferred embodiments of the present invention will be described with reference to the drawings in order to clarify the present invention.

The various preferred embodiments described herein are illustrative. Partial substitutions and combinations of the features and elements are possible between different preferred embodiments.

Figure 2:
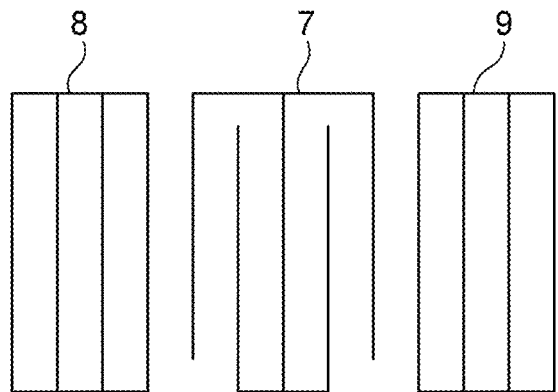
FIG. 2 is a schematic view illustrating the electrode structure of the acoustic wave device according to the first preferred embodiment of the present invention.
Figure 3:
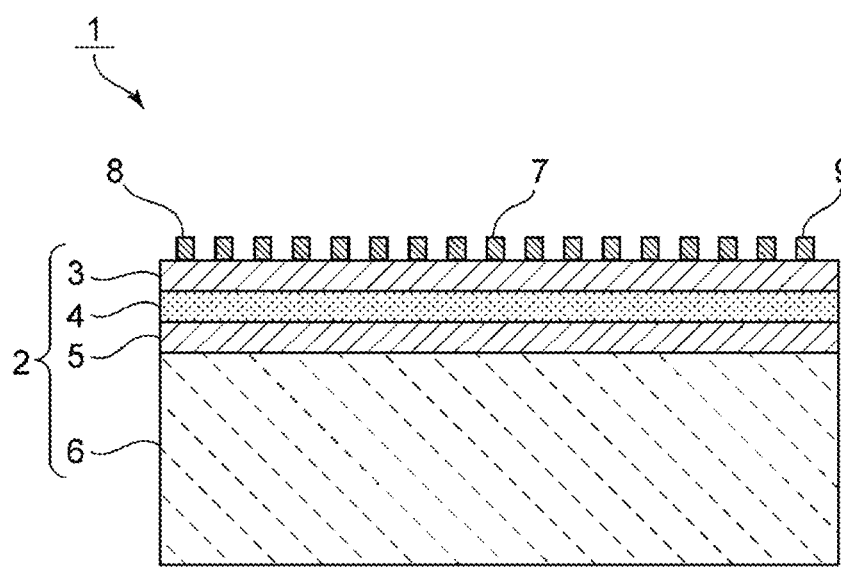
FIG. 3 is a front sectional view of the acoustic wave device according to the first preferred embodiment of the present invention.

FIG. 3 is a front sectional view of an acoustic wave device according to a first preferred embodiment of the present invention. An acoustic wave device 1 includes a piezoelectric substrate 2. The piezoelectric substrate 2 includes a piezoelectric film 3, a low acoustic velocity material layer 4, a high acoustic velocity material layer 5, and a supporting substrate 6. An IDT electrode 7 and reflectors 8 and 9 are provided on the piezoelectric substrate 2. As illustrated in a schematic view of FIG. 2, the electrode structure of the acoustic wave device 1 includes the IDT electrode 7, and the reflectors 8 and 9 on respective sides of the IDT electrode 7 in an acoustic wave propagation direction. As a result, a one-port acoustic wave resonator is configured.

The acoustic wave device 1 is characterized by the specific electrode structure of the IDT electrode 7. The electrode structure will be described in detail with reference to FIGS. 1, 4, 5A and 5B.

Figure 1:
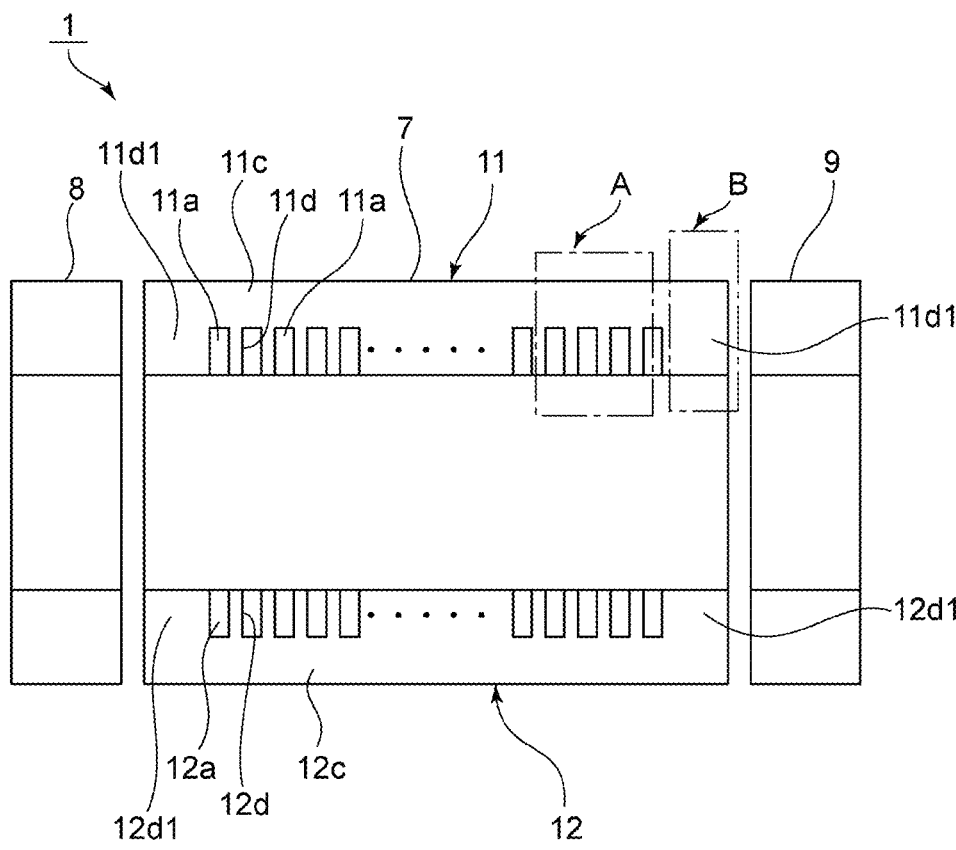
FIG. 1 is a schematic plan view for explaining an electrode structure of an acoustic wave device according to a first preferred embodiment of the present invention.

FIG. 1 is a schematic plan view illustrating the electrode structure of the acoustic wave device 1. The IDT electrode 7 includes a first busbar 11 and a second busbar 12 facing each other. The details of the IDT electrode 7 is illustrated in a partial cutaway view of FIG. 4. A plurality of first electrode fingers 13 are connected to the first busbar 11. Each first electrode finger 13 extends toward the second busbar 12 from the first busbar 11. A plurality of second electrode fingers 14 are connected to the second busbar 12. Each second electrode finger 14 extends toward the first busbar 11 from the second busbar 12. An intersection region K is a region in which the first electrode finger 13 and the second electrode finger 14 overlap each other when viewed in the acoustic wave propagation direction. The intersection region K includes a central region C, and a first low acoustic velocity region D1 and a second low acoustic velocity region D2 provided outside the central region C on respective sides in an extending direction of the first and second electrode fingers 13 and 14. Note that other regions may exist outside the first and second low acoustic velocity regions D1 and D2.

The IDT electrode 7 is made of a suitable metal or alloy. In the first and second velocity regions D1 and D2, as illustrated by the hatched portions with oblique lines, mass adding films 13a and 14a are provided on the first and second electrode fingers 13 and 14, respectively. The mass adding films 13a and 14a are made of metals or dielectrics. As illustrated on the right side of FIG. 4, since the mass adding films 13a and 14a are provided, compared to an acoustic velocity V1 in the central region C, acoustic velocities V2 in the first and second low acoustic velocity regions D1 and D2 are low.

Note that the mass adding films 13a and 14a may be laminated on the lower surface sides of the first and second electrode fingers 13 and 14, respectively.

Figure 4:
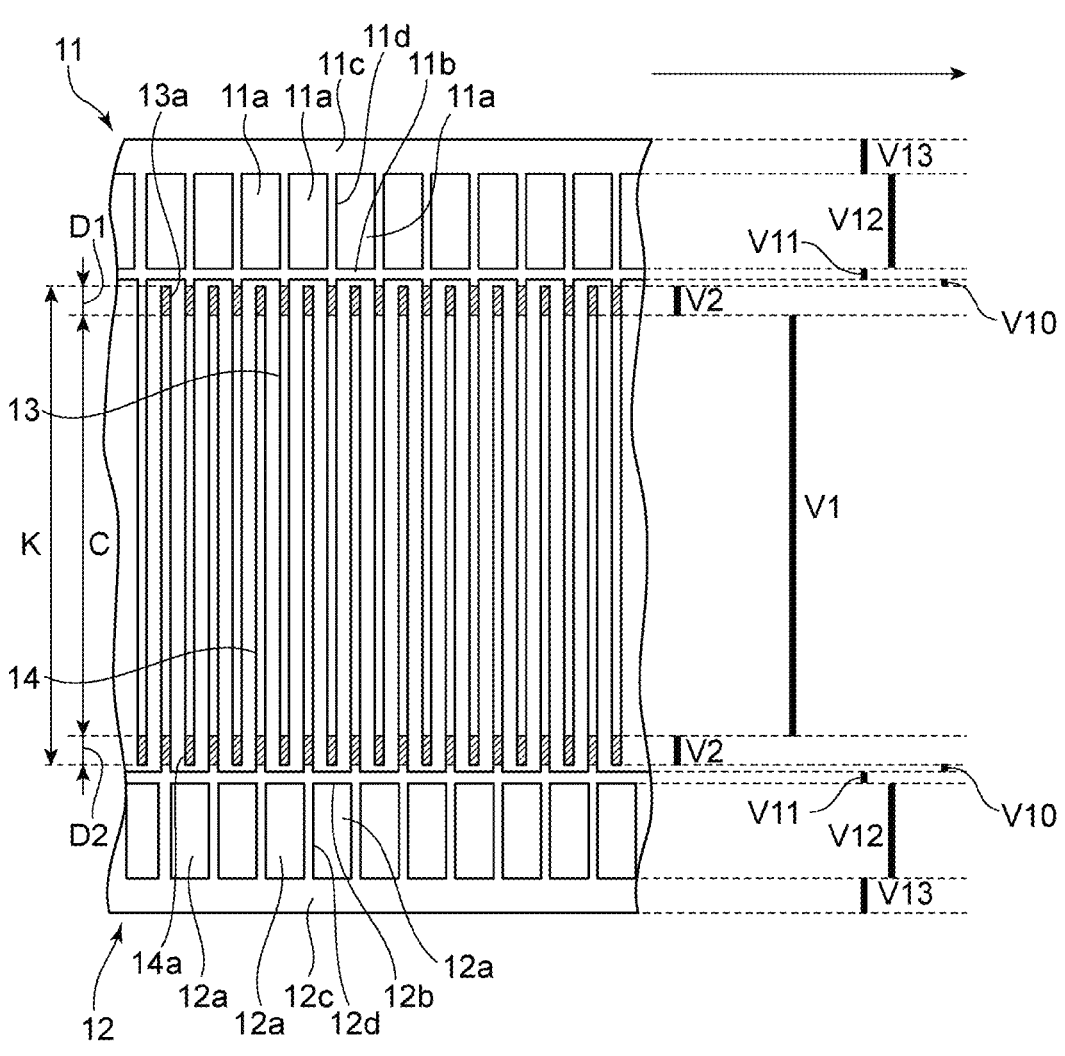
FIG. 4 is a partial cutaway view illustrating a main portion of an IDT electrode of the acoustic wave device according to the first preferred embodiment of the present invention.

Note that in FIG. 4, the mass adding films 13a and 14a are laminated on the first and second electrode fingers 13 and 14, respectively, but when the mass adding films 13a and 14a are made of dielectric films, a mass adding film may be structured to extend to a region between the first and second electrode fingers 13 and 14.

The first busbar 11 includes a plurality of cavities 11a in the acoustic wave propagation direction. In the first busbar 11, an inner busbar portion 11b is provided on an intersection region K side of the cavities 11a. An outer busbar portion 11c is provided in an outer region of the cavities 11a opposite to an intersection region K. In the first busbar 11, the inner busbar portion 11b and the outer busbar portion 11c are connected to each other by a plurality of connecting portions 11d. Although not particularly limited, each connecting portion 11d extends in a direction orthogonal to the acoustic wave propagation direction and, in the present preferred embodiment, is provided at a position at which the first electrode finger 13 is extended. Note that the inner busbar portion 11b is a first inner busbar portion in the present invention, and the outer busbar portion 11c is a first outer busbar portion.

The second busbar 12 is configured in a similar manner. That is, the second busbar 12 also includes a plurality of cavities 12a. In addition, an inner busbar portion 12b is provided on an intersection region K side of the cavities 12a. An outer busbar portion 12c is provided in an outer region of the cavities 12a opposite to the intersection region K. The inner busbar portion 12b and the outer busbar portion 12c are connected to each other by a plurality of connecting portions 12d. Note that the inner busbar portion 12b is a second inner busbar portion, and the outer busbar portion 12c is a second outer busbar portion.

Since the IDT electrode 7 has the above-described structure, acoustic velocities V10, V11, V12, and V13 illustrated in FIG. 4 are acoustic velocities in regions outside the first and second low acoustic velocity regions D1 and D2. That is, high acoustic velocity regions indicated by the acoustic velocities V10, V11, and V12 are located outside the first and second low acoustic velocity regions D1 and D2 in the extending direction of the first and second electrode fingers 13 and 14. Therefore, transverse mode ripples can be effectively confined.

Figure 5A:
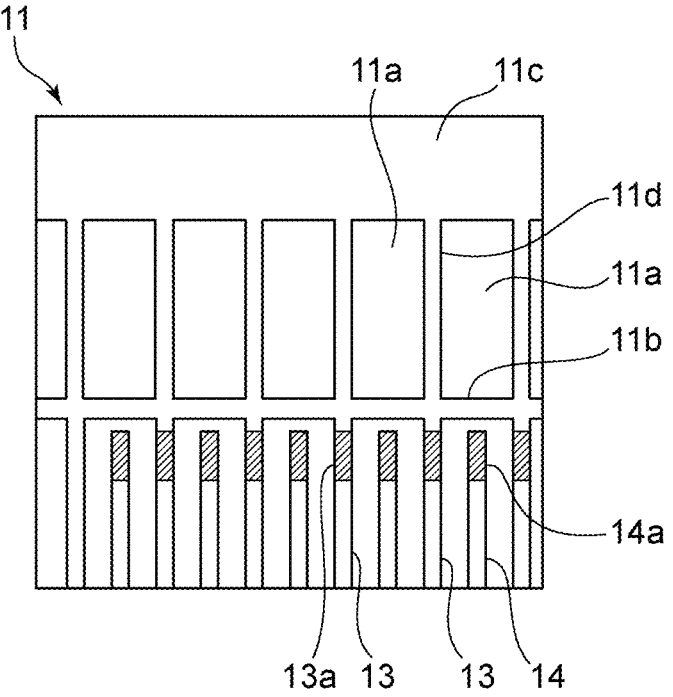
FIGS. 5A and 5B are partial plan views illustrating portions indicated by arrows A and B in FIG. 1, in an enlarged view.
Figure 5B:
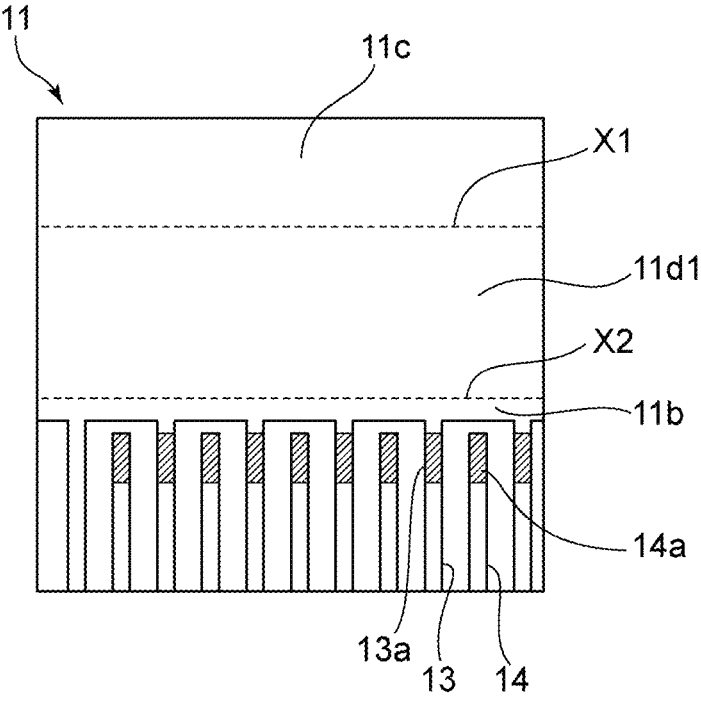

FIG. 5A is a partial plan view illustrating a main portion of the IDT electrode 7 illustrated in FIG. 4, that is, the portion indicated by an arrow A in FIG. 1, in an enlarged view. FIG. 5B is a partial plan view illustrating the portion indicated by an arrow B in FIG. 1, in an enlarged view.

The first busbar 11 includes a wide width connecting portion 11d1. The wide width connecting portion 11d1 has a dimension extending in the acoustic wave propagation direction, that is, a width larger than the remaining connecting portions 11d (FIG. 5A). In FIG. 5B, a boundary between the outer busbar portion 11c and the wide width connecting portion 11d1 is indicated by a broken line X1. In addition, a boundary between the wide width connecting portion 11d1 and the inner busbar portion 11b is indicated by a broken line X2.

Since the width of the wide width connecting portion 11d1 is wider than the width of each of the remaining connecting portions 11d, in the first busbar 11, electric resistance between the outer busbar portion 11c and the inner busbar portion 11b can be reduced. Therefore, degradation of the Q characteristics can be suppressed.

In particular, as illustrated in FIG. 1, in the present preferred embodiment, a pair of the wide width connecting portions 11d1 and 11d1 is provided so as to be separated in the acoustic wave propagation direction of the first busbar 11. In the second busbar 12, wide width connecting portions 12d1 and 12d1 are also provided so as to be separated in the acoustic wave propagation direction. Since a plurality of wide width connecting portions 11d1 and 11d1 or a plurality of wide width connecting portions 12d1 and 12d1 are provided, electric resistance between the above outer busbar portions 11c and 12c and the inner busbar portions 11b and 12b can be further reduced. Therefore, degradation of the Q characteristics can be further effectively suppressed.

Note that in a preferred embodiment of the present invention, the wide width connecting portion may be provided in at least one place in at least one of the first busbar 11 and the second busbar 12. Therefore, only one wide width connecting portion 11d1 may be provided in the first busbar 11.

It is preferable that the wide width connecting portions are provided in both of the first busbar 11 and the second busbar 12. In addition, as in the present preferred embodiment, it is more preferable that a plurality of wide width connecting portions 11d1 and 11d1 and a plurality of wide width connecting portions 12d1 and 12d1 are provided in the first busbar 11 and the second busbar 12, respectively.

As illustrated in FIG. 1, a pair of the wide width connecting portions 11d1 and 11d1 is provided at respective ends in the acoustic wave propagation direction of the first busbar 11. In the second busbar 12 as well, a pair of the wide width connecting portions 12d1 and 12d1 is provided at respective ends in the acoustic wave propagation direction. Therefore, leakage of acoustic wave energy is reduced, and, in the present preferred embodiment, reduction of a Q value is even more unlikely to occur. Therefore, more preferably, it is desirable that, in at least one of the first busbar 11 and the second busbar 12, the wide width connecting portions 11d1 and 11d1 or the wide width connecting portions 12d1 and 12d1 are provided at respective ends in the acoustic wave propagation direction.

The width of each of the above wide width connecting portions 11d1 and 12d1 is sufficient as long as the width is larger than the width of each of the remaining connecting portions 11d and 12d, but is preferably equal to or more than about 10 μm and equal to or less than about 30 μm, for example. In addition, when $\lambda$ is a wavelength determined by electrode finger pitches of the first and second electrode fingers 13 and 14, the width of each of the above wide width connecting portions 11d1 and 12d1 is preferably equal to or more than about $1\lambda$ and equal to or less than about $10\lambda$, for example. When the width is equal to or more than $1\lambda$, a decrease in the above Q value can be more effectively suppressed. In addition, when the width is equal to or less than $10\lambda$, transverse mode ripples can be more effectively suppressed.

In the reflectors 8 and 9, both ends of a plurality of electrode fingers are short circuited by a pair of busbars. That is, the reflectors 8 and 9 are grating reflectors, and the structures thereof are not particularly limited.

As illustrated in FIG. 3, the piezoelectric substrate 2 includes a structure in which the high acoustic velocity material layer 5, the low acoustic velocity material layer 4, and the piezoelectric film 3 are laminated on the supporting substrate 6 in this order. The supporting substrate 6 is made of a suitable semiconductor or dielectric material such as Si or alumina.

As the piezoelectric film 3, a piezoelectric monocrystal such as LiTao$_3$ can be used. The low acoustic velocity material layer 4 is made of a low acoustic velocity material. The low acoustic velocity material refers to a material in which an acoustic velocity of a bulk wave that propagates through the low acoustic velocity material is lower than an acoustic velocity of a bulk wave that propagates through the piezoelectric film 3. Examples of such a low acoustic velocity material include glass, silicon oxide, silicon oxynitride, lithium oxide, tantalum pentoxide, or a material containing compounds obtained by adding fluorine, carbon, or boron to silicon oxide as principal components, or the like.

The high acoustic velocity material layer 5 is made of a high acoustic velocity material in which an acoustic velocity of a bulk wave that propagates through the high acoustic velocity material is higher than an acoustic velocity of an acoustic wave that propagates through the piezoelectric film 3. Examples of such a high acoustic velocity material include silicon, aluminum oxide, silicon carbide, silicon oxynitride, sapphire, lithium tantalate, lithium niobate, crystal, alumina, zirconia, cordierite, mullite, steatite, forsterite, magnesia, or media containing the above materials as principal components such as a diamond-like carbon (DLC) film, diamond, or the like.

Note that the low acoustic velocity material layer 4 may be omitted.

Since the piezoelectric substrate 2 has the laminated structure described above, the acoustic wave energy can be effectively confined in the piezoelectric film 3.

Next, the Q characteristics of Example 1 of the first preferred embodiment and Comparative Example 1 will be shown to clarify the effects of the present preferred embodiment.

Design parameters of Example 1 are as follows.

Material of the IDT electrode 7 and the reflectors 8 and 9: Al. Wavelength $\lambda$ determined by electrode finger pitches=2.12 μm. Electrode film thickness=0.047$\lambda$. Dimension of the intersection region K=23.58$\lambda$. Length of the central region C=21.77$\lambda$. Length of the first and second low acoustic velocity regions D1 and D2=0.90$\lambda$. Width of the inner busbar portions 11b and 12b (dimension in the extending direction of the first and second electrode fingers 13 and 14)=0.20$\lambda$. Dimension of the cavities 11a and 12a extending in the acoustic wave propagation direction=2.00$\lambda$. Dimension in the extending direction of the first and second electrode fingers 13 and 14=0.43$\lambda$. Width of the connecting portions 11d and 12d=1.13$\lambda$. Width of the wide width connecting portions 11d1 and 12d1=100.46$\lambda$. Width of the outer busbar portions 11c and 12c (dimension in the extending direction of the first and second electrode fingers 13 and 14)=5.66$\lambda$. Number of pairs of electrode fingers=100. The piezoelectric film 3=LiTaO$_3$ having a thickness of 0.19$\lambda$. The low acoustic velocity material layer 4: SiN having a thickness of 0.14$\lambda$. The high acoustic velocity material layer 5: SiO$_2$ having a thickness of 0.14$\lambda$. The supporting substrate 6: Si.

In Comparative Example 1, the above wide width connecting portions 11d1 and 11d1, and 12d1 and 12d1 are not provided, and the portions including the wide width connecting portions 11d1 and 11d1, and 12d1 and 12d1 in Example 1 are configured in the same manner as the portions including the remaining connecting portions 11d and 12d. Other configurations in Comparative Example 1 are the same as those in Example 1.

Figure 6:
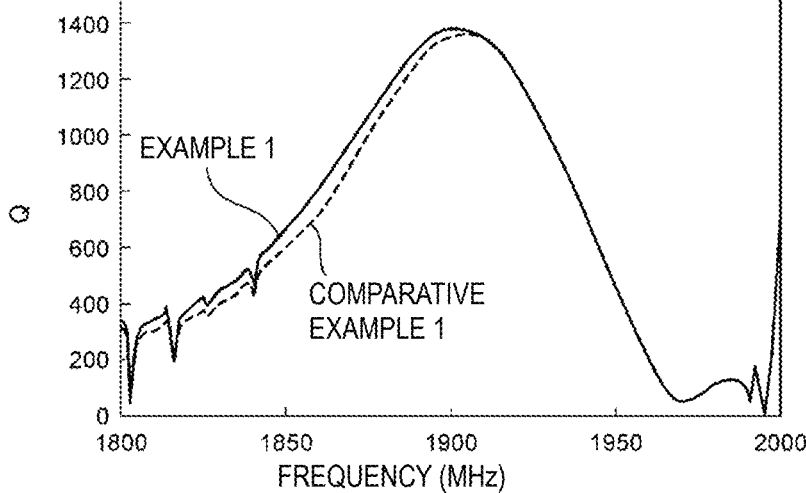
FIG. 6 is a graph showing Q characteristics of Example 1 and Comparative Example 1.
Figure 7:
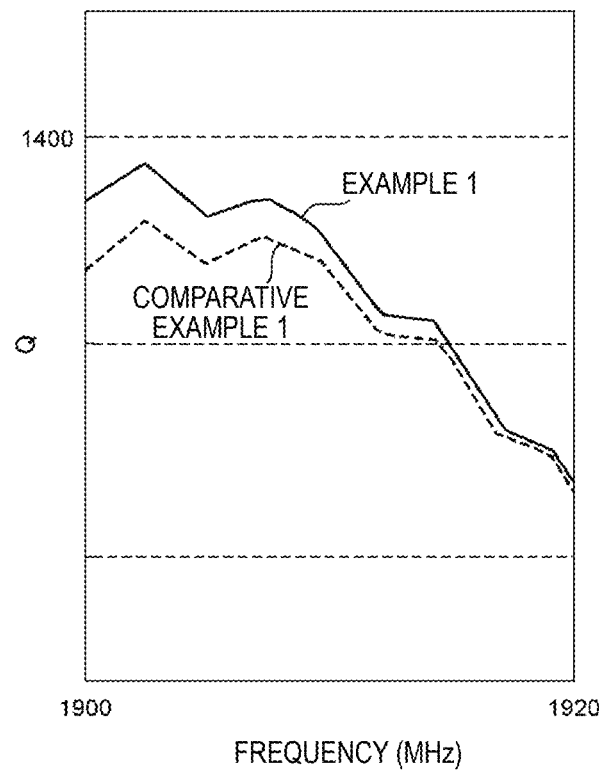
FIG. 7 is a graph showing a portion of the Q characteristics graph of FIG. 6 in an enlarged view.

FIG. 6 is a graph showing the Q characteristics of Example 1 as an example of the acoustic wave device 1 of the first preferred embodiment and Comparative Example 1. The solid line indicates the results of Example 1, and the broken line indicates the results of Comparative Example 1. FIG. 7 is a graph showing a portion of FIG. 6 in an enlarged view. As it is evident from FIGS. 6 and 7, around 1900 MHz where the Q values are the highest, according to Example 1, the Q value can be effectively increased compared to Comparative Example 1. That is, compared to Comparative Example 1, degradation of the Q characteristics is less likely to be generated.

Figure 8:
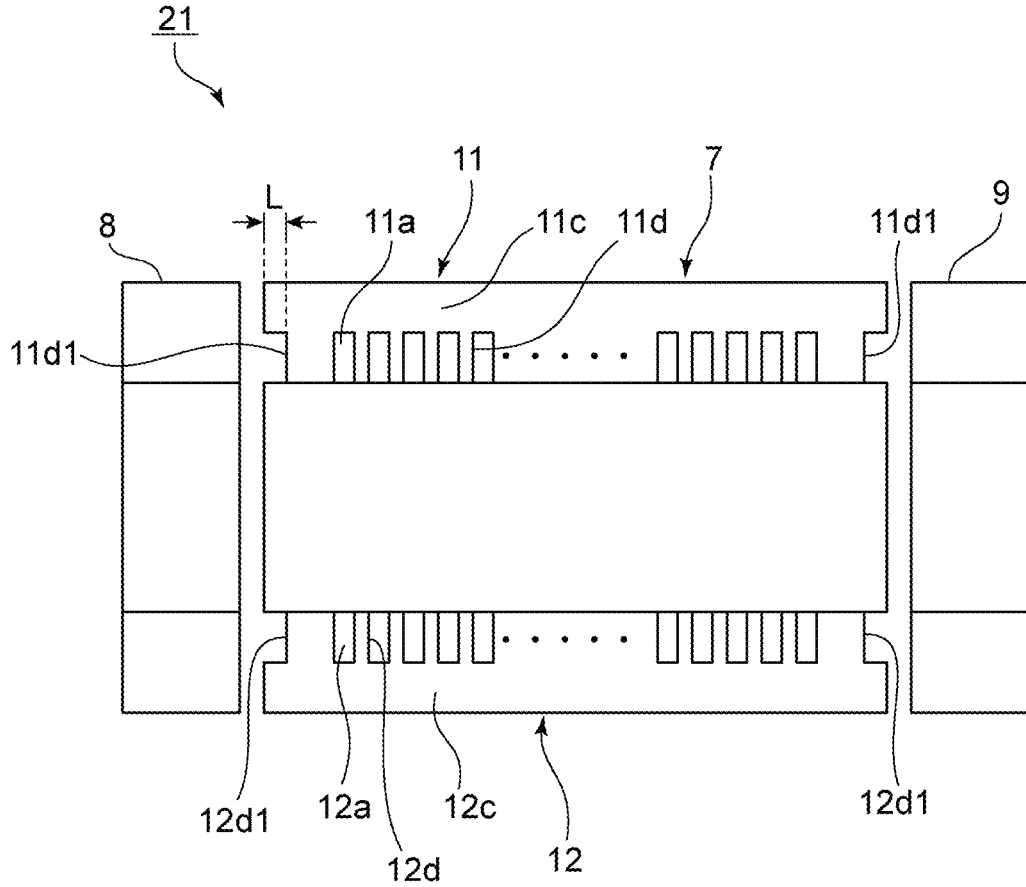
FIG. 8 is a schematic plan view illustrating an electrode structure of an acoustic wave device according to a second preferred embodiment of the present invention.

FIG. 8 is a schematic plan view illustrating an electrode structure of an acoustic wave device according to a second preferred embodiment of the present invention. In an acoustic wave device 21, in the IDT electrode 7, the positions of the wide width connecting portions 11*d*1 and 12*d*1 extending in the acoustic wave propagation direction are changed. Other configurations of the acoustic wave device 21 are the same as those of the acoustic wave device 1.

As illustrated in FIG. 8, the wide width connecting portions 11*d*1 and 11*d*1 are located inside the respective ends in the acoustic wave propagation direction of the first busbar 11 in the acoustic wave propagation direction. More precisely, when L represents a distance between one end in the acoustic wave propagation direction of the first busbar 11 and the wide width connecting portion 11*d*1, L>0 is satisfied. The wide width connecting portion 12*d*1 in the second busbar 12 is also disposed in the same manner.

In the acoustic wave device 21, as described above, the wide width connecting portions 11*d*1 and 12*d*1 are located inside the end portions of the first and second busbars 11 and 12, respectively, in the acoustic wave propagation direction. In this manner, the wide width connecting portions 11*d*1 and 12*d*1 may be located inside the end portions of the first and second busbars 11 and 12 in the acoustic wave propagation direction. In this case as well, by reducing the electric resistance, degradation of the Q characteristics can be suppressed.

Acoustic wave devices of the following Examples 2 to 4 are configured using the same design parameters as the acoustic wave device of the above Example 1 except for the distance L.

Example 2: L=10 μm=4.7λ.
Example 3: L=20 μm=9.4λ.
Example 4: L=30 μm=14.1λ.

Figure 9:
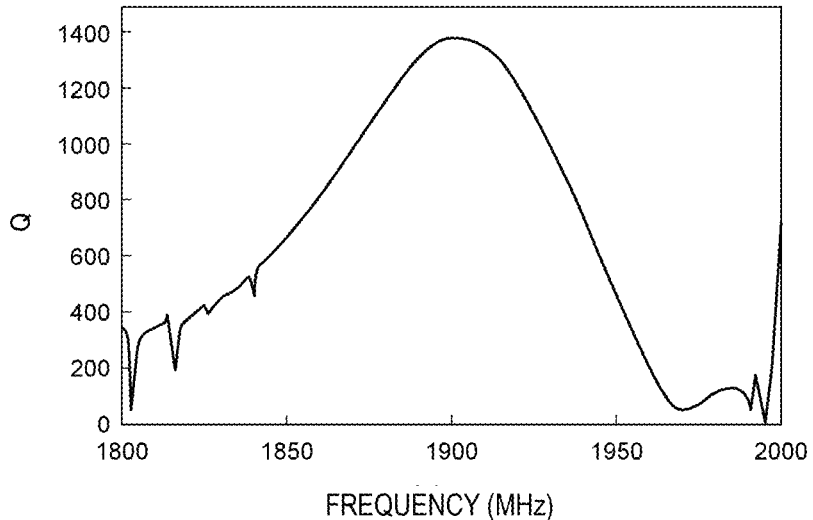
FIG. 9 is a graph showing Q characteristics of acoustic wave devices of Examples 1 to 4.
Figure 10:
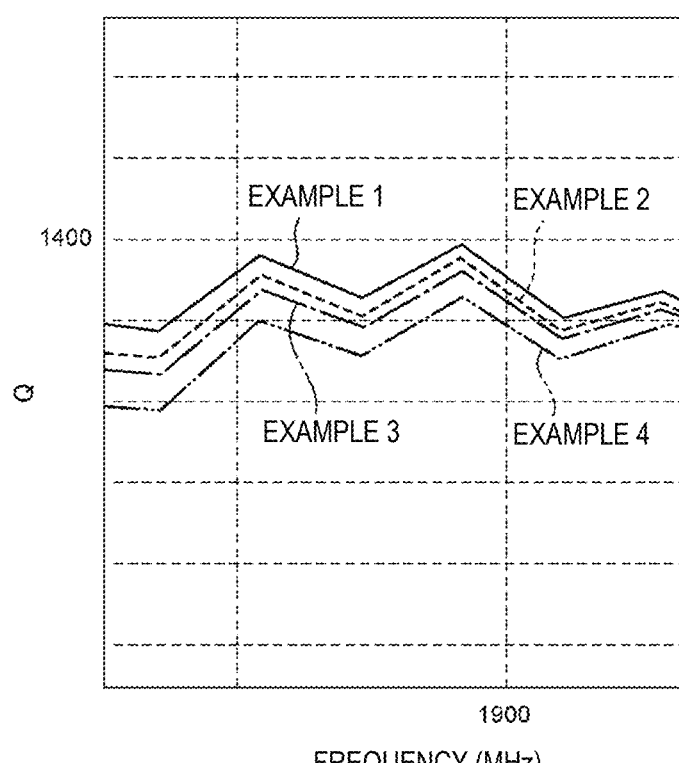
FIG. 10 is a graph showing a portion of FIG. 9 in an enlarged view.

The Q characteristics of the acoustic wave devices of Example 1 and Examples 2 to 4 are shown in FIG. 9. In addition, a portion of FIG. 9 is shown in FIG. 10 in an enlarged view. In FIG. 10, the solid line indicates the results of Example 1, the broken line indicates the results of Example 2, the dashed line indicates the results of Example 3, and the two-dot line indicates the results of Example 4. As it is evident from FIG. 10, compared to Examples 2 to 4, Example 1 is less likely to generate degradation of the Q characteristics and is more preferable. In addition, Examples 2 to 4 show that degradation of the Q characteristics can be suppressed as the above L decreases. Therefore, more preferably, L=less than 20 μm, and further more preferably, L=less than 9.4λ.

Figure 11:
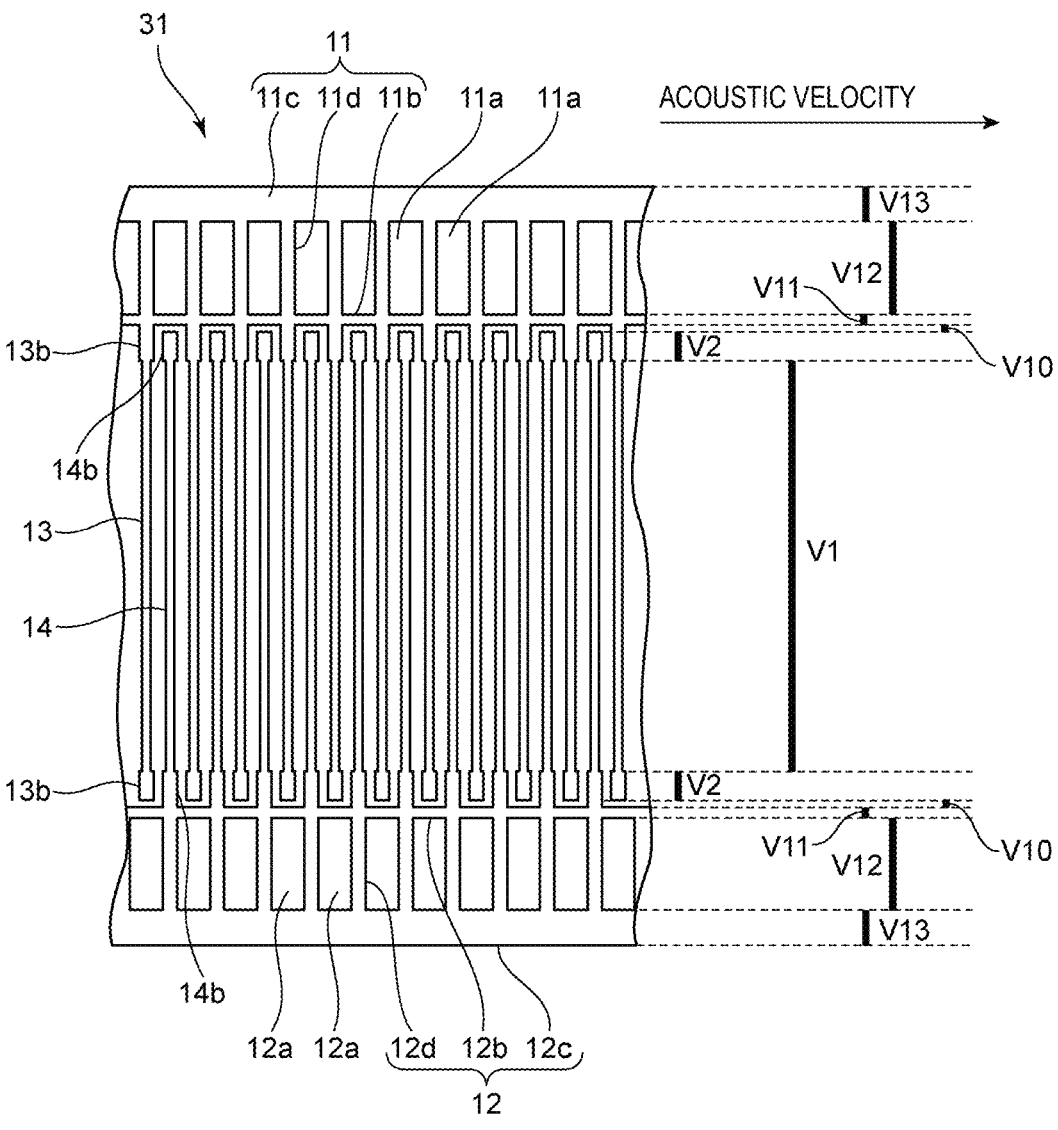
FIG. 11 is a partial cutaway view illustrating an electrode structure of an acoustic wave device according to a third preferred embodiment of the present invention.

FIG. 11 is a partial cutaway view for explaining an electrode structure according to a third preferred embodiment of the present invention. In the third preferred embodiment, each first electrode finger 13 and each second electrode finger 14 include a wide width portion 13*b* and a wide width portion 14*b*, respectively. Regions including the wide width portions 13*b* and 14*b* are low acoustic velocity regions. Other configurations of an acoustic wave device 31 in the third preferred embodiment are the same as those of the acoustic wave device 1 of the first preferred embodiment. In this manner, in the present invention, the first and second low acoustic velocity regions may be configured by including not mass adding films, but the wide width portions

13*b* and the wide width portion 14*b* as a portion of the first electrode finger 13 and a portion of the second electrode finger 14, respectively.

Figure 12:
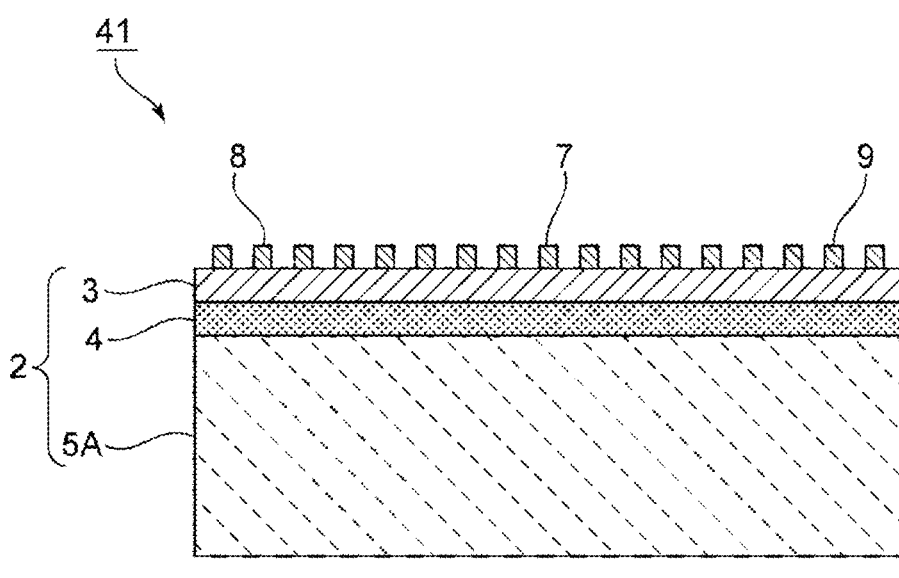
FIG. 12 is a front sectional view of an acoustic wave device according to a fourth preferred embodiment of the present invention.

FIG. 12 is a front sectional view of an acoustic wave device according to a fourth preferred embodiment of the present invention. In an acoustic wave device 41, the piezoelectric substrate 2 includes a high acoustic velocity supporting substrate 5A. The high acoustic velocity supporting substrate 5A is made of the high acoustic velocity material described earlier. In this case, the high acoustic velocity supporting substrate 5A is used in place of the supporting substrate 6 illustrated in FIG. 3. Therefore, the high acoustic velocity material layer 5 illustrated in FIG. 3 can be omitted.

Figure 13:
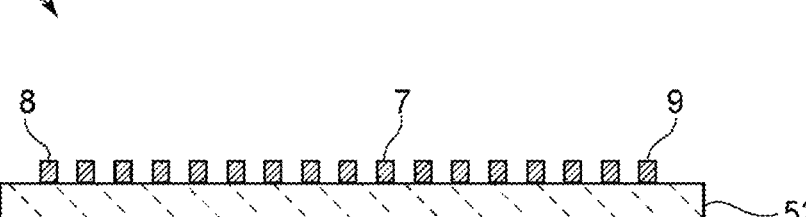
FIG. 13 is a front sectional view of an acoustic wave device according to a fifth preferred embodiment of the present invention.

FIG. 13 is a front sectional view of an acoustic wave device according to a fifth preferred embodiment of the present invention. In an acoustic wave device 51, as a piezoelectric substrate, a piezoelectric substrate 52 is used. The piezoelectric substrate 52 is made of a monocrystal such as LiNbO₃ or LiTaO₃. In a preferred embodiment of the present invention, the piezoelectric substrate may be formed of a single piezoelectric monocrystal substrate as described above.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric substrate; and
an IDT electrode on the piezoelectric substrate; wherein
the IDT substrate includes a first busbar and a second busbar facing each other, a plurality of first electrode fingers extending toward the second busbar from the first busbar, and a plurality of second electrode fingers extending toward the first busbar from the second busbar;
an intersection region in which the first electrode fingers and the second electrode fingers overlap each other in an acoustic wave propagation direction includes a central region at a center in an extending direction of the first electrode fingers and the second electrode fingers, and a first low acoustic velocity region and a second low acoustic velocity region outside the central region on respective sides in the extending direction of the first electrode fingers and the second electrode fingers;
acoustic velocities in the first low acoustic velocity region and the second low acoustic velocity region are lower than an acoustic velocity in the central region;
the first busbar and the second busbar each include a plurality of cavities arranged in the acoustic wave propagation direction;
a portion on an intersection region side of the plurality of cavities in the first busbar and a portion on an intersection region side of the plurality of cavities in the second busbar are a first inner busbar portion and a second inner busbar portion, respectively;
a portion on a side opposite to the intersection region of the plurality of cavities in the first busbar and a portion on a side opposite to the intersection region of the plurality of cavities in the second busbar are a first outer busbar portion and a second outer busbar portion, respectively;

the first inner busbar portion and the second inner busbar portion are connected to the first outer busbar portion and the second outer busbar portion by a plurality of connecting portions; and at least one of the plurality of connecting portions is a wide width connecting portion with a dimension in the acoustic wave propagation direction larger than a dimension of each of remaining ones of the plurality of connecting portions.

2. The acoustic wave device according to claim 1, wherein the wide width connecting portion includes a plurality of wide width connecting portions in the first busbar and the second busbar.

3. The acoustic wave device according to claim 2, wherein the plurality of wide width connecting portions include a pair of wide width connecting portions in at least one of the first busbar and the second busbar.

4. The acoustic wave device according to claim 3, wherein the pair of wide width connecting portions are located at respective ends in the acoustic wave propagation direction in at least one of the first and second busbars.

5. The acoustic wave device according to claim 1, wherein the wide width connecting portion has a dimension, extending in the acoustic wave propagation direction, in a range of about 1λ to about 10λ, when a wavelength λ is determined by electrode finger pitches of the first and the second electrode fingers of the IDT electrode.

6. The acoustic wave device according to claim 1, wherein in the first and second low acoustic velocity regions, mass adding films laminated on the first electrode fingers and the second electrode fingers are provided.

7. The acoustic wave device according to claim 1, wherein the first electrode fingers and the second electrode fingers in the first and second low acoustic velocity regions have widths larger than widths of the first electrode fingers and the second electrode fingers in the central region.

8. The acoustic wave device according to claim 1, wherein the piezoelectric substrate includes a piezoelectric film and a high acoustic velocity material layer made of a high acoustic velocity material in which an acoustic velocity of a bulk wave that propagates through the high acoustic velocity material is higher than an acoustic velocity of an acoustic wave that propagates through the piezoelectric film.

9. The acoustic wave device according to claim 8, further comprising a low acoustic velocity material layer that is laminated between the high acoustic velocity material layer and the piezoelectric film and is made of a low acoustic velocity material in which an acoustic velocity of a bulk wave that propagates through the low acoustic velocity material is lower than an acoustic velocity of a bulk wave that propagates through the piezoelectric film.

10. The acoustic wave device according to claim 7, wherein the high acoustic velocity material layer is a high acoustic velocity supporting substrate made of the high acoustic velocity material.

11. The acoustic wave device according to claim 1, wherein the piezoelectric substrate is a piezoelectric substrate made of a piezoelectric monocrystal.

12. The acoustic wave device according to claim 1, wherein the acoustic wave device is a one-port acoustic wave resonator.

13. The acoustic wave device according to claim 1, further comprising reflectors at both sides of the IDT electrode on the piezoelectric substrate.

14. The acoustic wave device according to claim 6, wherein the mass adding films are made of metals or dielectrics.

15. The acoustic wave device according to claim 6, wherein the mass adding films are on lower surface sides of the first and second electrode fingers.

16. The acoustic wave device according to claim 1, wherein the mass adding films are dielectric films and extend to a region between the first and second electrode fingers.

17. The acoustic wave device according to claim 2, wherein a pair of the plurality of wide width connecting portions in the first busbar is separated in the acoustic wave propagation direction, and a pair of the plurality of wide width connecting portions in the second busbar is separated in the acoustic wave propagation direction.

18. The acoustic wave device according to claim 2, wherein a width of each of the plurality of wide width connecting portions is equal to or more than about 10 μm and equal to or less than about 30 μm.

19. The acoustic wave device according to claim 13, wherein the reflectors are grating reflectors.

20. The acoustic wave device according to claim 9, wherein the piezoelectric film is made of a piezoelectric monocrystal;

the low acoustic velocity material layer is made of glass, silicon oxide, silicon oxynitride, lithium oxide, tantalum pentoxide, or a material containing compounds obtained by adding fluorine, carbon, or boron to silicon oxide as principal components; and the high acoustic velocity material layer is made of silicon, aluminum oxide, silicon carbide, silicon oxynitride, sapphire, lithium tantalate, lithium niobate, crystal, alumina, zirconia, cordierite, mullite, steatite, forsterite, magnesia, a diamond-like carbon (DLC) film or diamond.

* * * * *